United States Patent
Kim et al.

(10) Patent No.: US 10,323,159 B2
(45) Date of Patent: Jun. 18, 2019

(54) ORGANIC LAYER COMPOSITION AND METHOD OF FORMING PATTERNS

(71) Applicant: SAMSUNG SDI CO., LTD., Yongin-si, Gyeonggi-do (KR)

(72) Inventors: Minsoo Kim, Suwon-si (KR); Younhee Nam, Suwon-si (KR); Jaeyeol Baek, Suwon-si (KR); Hyunji Song, Suwon-si (KR); Byeri Yoon, Suwon-si (KR); Seulgi Jeong, Suwon-si (KR); Seunghee Hong, Suwon-si (KR); Sunmin Hwang, Suwon-si (KR)

(73) Assignee: Samsung SDI Co., Ltd., Yongin-Si, Gyeonggi-do (KR)

( * ) Notice: Subject to any disclaimer, the term of this patent is extended or adjusted under 35 U.S.C. 154(b) by 0 days.

(21) Appl. No.: 15/076,694

(22) Filed: Mar. 22, 2016

(65) Prior Publication Data

US 2016/0355699 A1    Dec. 8, 2016

(30) Foreign Application Priority Data

Jun. 2, 2015  (KR) .................. 10-2015-0078036

(51) Int. Cl.
| | |
|---|---|
| *C08G 8/10* | (2006.01) |
| *C09D 161/06* | (2006.01) |
| *H01L 21/033* | (2006.01) |
| *C08G 8/20* | (2006.01) |
| *C08G 8/24* | (2006.01) |
| *G03F 7/075* | (2006.01) |
| *G03F 7/09* | (2006.01) |

(52) U.S. Cl.
CPC .............. *C09D 161/06* (2013.01); *C08G 8/10* (2013.01); *C08G 8/20* (2013.01); *C08G 8/24* (2013.01); *G03F 7/0752* (2013.01); *G03F 7/094* (2013.01); *H01L 21/0332* (2013.01)

(58) Field of Classification Search
None
See application file for complete search history.

(56) References Cited

U.S. PATENT DOCUMENTS

| | | | | |
|---|---|---|---|---|
| 2008/0305441 A1* | 12/2008 | Yoon | ............... | G03F 7/091 |
| | | | | 430/323 |
| 2010/0021830 A1* | 1/2010 | Kim | ............... | G03F 7/091 |
| | | | | 430/5 |
| 2012/0168894 A1* | 7/2012 | Kim | ............... | G03F 7/094 |
| | | | | 257/499 |
| 2014/0183701 A1* | 7/2014 | Choi | ............... | H01L 21/02118 |
| | | | | 257/618 |

FOREIGN PATENT DOCUMENTS

| | | |
|---|---|---|
| CN | 101477307 | 7/2009 |
| CN | 101641390 A | 2/2010 |
| CN | 101681096 A | 3/2010 |
| CN | 104024940 A | 9/2014 |
| JP | 4883286 B2 | 2/2012 |
| JP | 5157560 B2 | 3/2013 |
| JP | 5440755 B2 | 3/2014 |
| JP | 5538941 B2 | 7/2014 |
| JP | 5573230 B2 | 8/2014 |
| JP | 2014-219559 A | 11/2014 |
| KR | 10-0500453 B1 | 7/2005 |
| KR | 20080107210 | 12/2008 |
| KR | 10-2012-0077466 A | 7/2012 |
| KR | 10-1174086 B1 | 8/2012 |
| KR | 10-2014-0117769 A | 1/2014 |
| KR | 10-2014-0117769 A | 10/2014 |
| WO | WO 2009/072465 A1 | 6/2009 |
| WO | WO 2011/099235 A1 | 8/2011 |
| WO | WO 2013/100409 A1 | 7/2013 |

OTHER PUBLICATIONS

Taiwanese Search Report dated Sep. 22, 2016 in Corresponding Taiwanese Patent Application No. 105109598.
Chinese Office Action dated Apr. 10, 2019.

* cited by examiner

*Primary Examiner* — Robert C Boyle
(74) *Attorney, Agent, or Firm* — Lee & Morse, P.C.

(57) ABSTRACT

An organic layer composition includes a first compound having a thermal shrinkage ratio of about 10% to about 70%, a second compound having a smaller thermal shrinkage ratio than the first compound, and a solvent, and an organic layer obtained by curing the organic layer composition and a method of forming patterns using the organic layer composition are disclosed.

A method of measuring the thermal shrinkage ratio is described in the detailed description.

11 Claims, 1 Drawing Sheet

[FIG. 1]
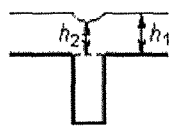
[Calculation Equation 2]
Step = Thickness in peri portion ($h_1$) − Thickness in the center of cell ($h_2$)
[FIG. 2]
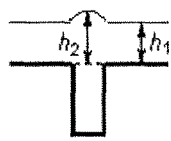
[Calculation Equation 2]
Step = Thickness in peri portion ($h_1$) − Thickness in the center of cell ($h_2$)

ORGANIC LAYER COMPOSITION AND METHOD OF FORMING PATTERNS

CROSS-REFERENCE TO RELATED APPLICATION

Korean Patent Application No. 10-2015-0078036, filed on Jun. 2, 2015, in the Korean Intellectual Property Office, and entitled: "Organic Layer Composition and Method of Forming Patterns," is incorporated by reference herein in its entirety.

BACKGROUND

1. Field

Embodiments relate to an organic layer composition, an organic layer manufactured using the organic layer composition, and a method of forming a pattern using the organic layer composition.

2. Description of the Related Art

Recently, the semiconductor industry has developed an ultra-fine techniques to provide patterns of several to several tens of nanometers in size. Effective lithographic techniques are desirable for such ultrafine techniques.

SUMMARY

Embodiments are directed to an organic layer composition including a first compound having a thermal shrinkage ratio of about 10% to about 70%, a second compound having a smaller thermal shrinkage ratio than the first compound, and a solvent. The thermal shrinkage ratio is calculated by the Method of Measuring a Thermal Shrinkage Ratio as defined in the specification.

The first compound and the second compound may be included in a weight ratio of about 1:99 to about 99:1.

The thermal shrinkage ratio of the first compound may be about 10% to about 60%.

The first compound may be a moiety represented by Chemical Formula 1:

[Chemical Formula 1]

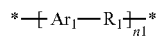

In Chemical Formula 1, $Ar_1$ is a cyclic group including at least one substituted or unsubstituted benzene ring, $R_1$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, $n_1$ is an integer of 1 to 100, and * is a linking point.

$Ar_1$ in Chemical Formula 1 may be selected from Group 1:

[Group 1]

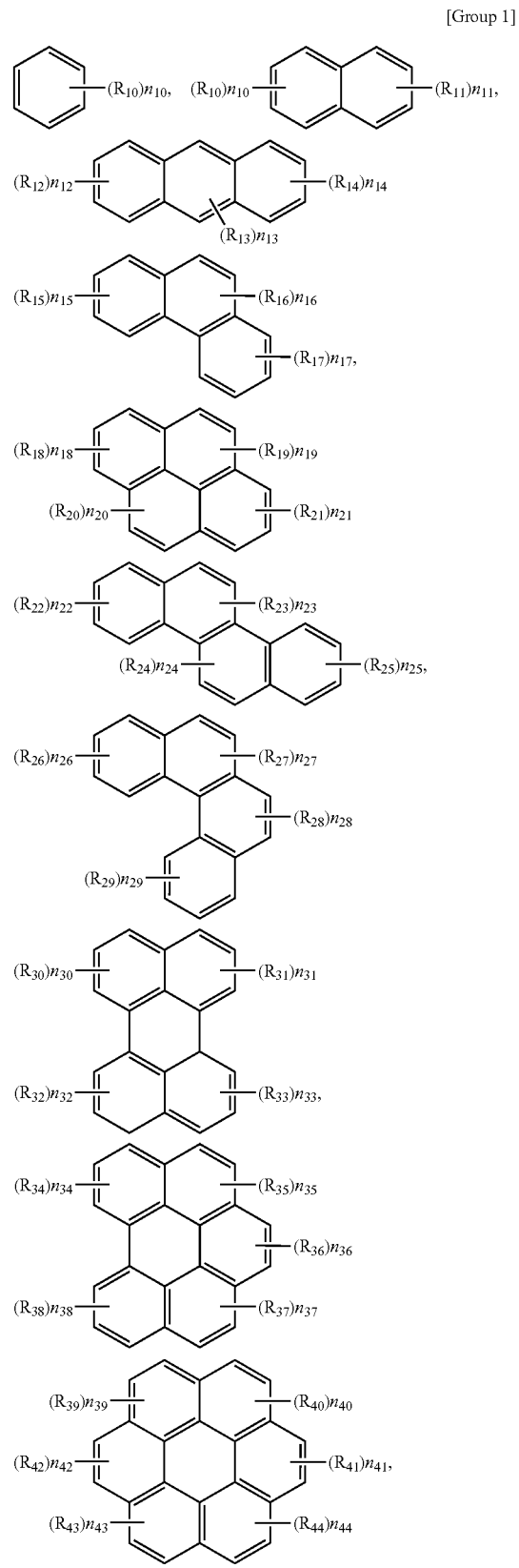

-continued

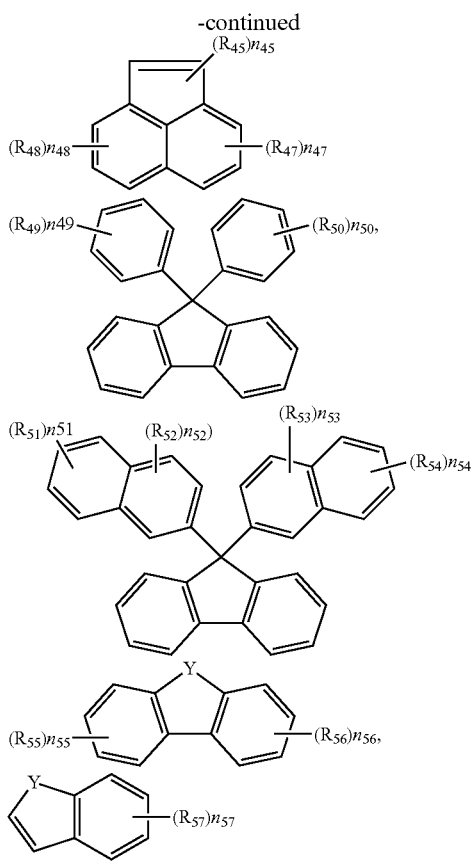

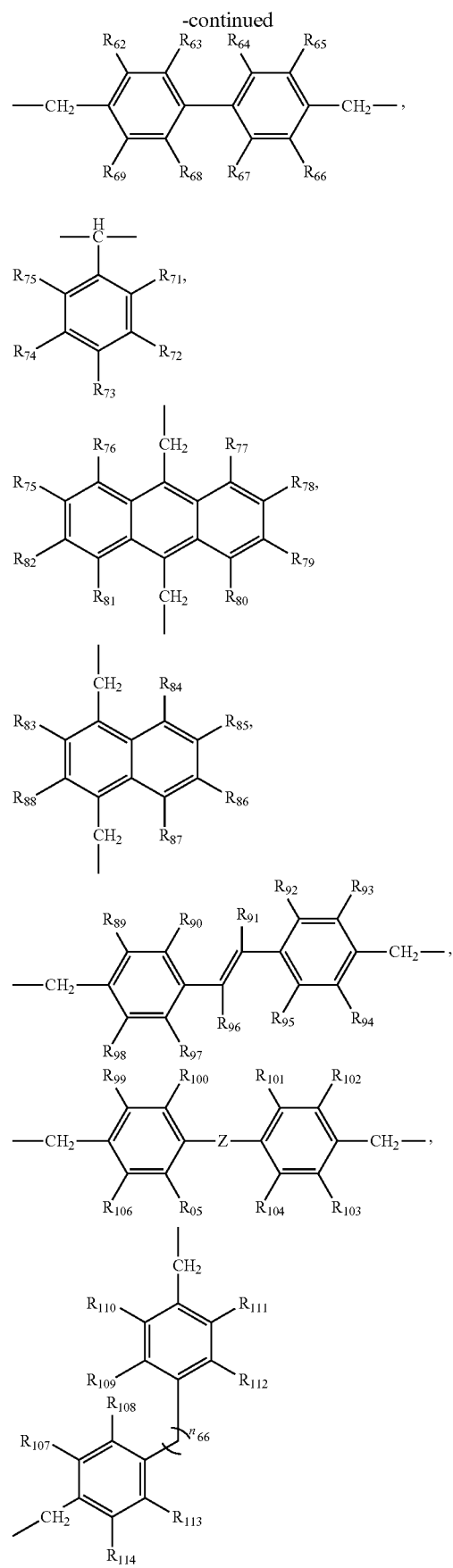

In Group 1, $R_{10}$ to $R_{45}$ and $R_{47}$ to $R_{57}$ are independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C20 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, $n_{10}$ to $n_{45}$ and $n_{47}$ to $n_{57}$ are independently integers of 1 to 6, as further limited by the number of binding sites of the ring to which the respective one of $R_{10}$ to $R_{45}$ and $R_{47}$ to $R_{57}$ is attached, and Y is C=O, oxygen (O), sulfur (S), $CR^bR^c$, $NR^d$, or a combination thereof, where $R^b$ to $R^d$ is independently hydrogen, a substituted or unsubstituted C1 to C10 alkyl group, a halogen atom, or a combination thereof.

In Chemical Formula 1, $R_1$ may be selected from Group 2:

[Group 2]

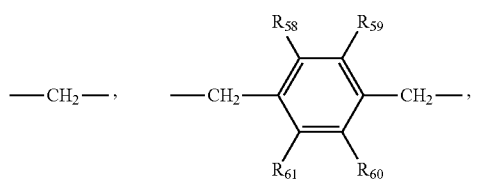

In Group 2, $R_{58}$ to $R_{114}$ are independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C20 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, $n_{66}$ is an integer of 0 to 30, and Z is C=O, oxygen (O), sulfur (S), $CR^bR^c$, $NR^d$, or a combination thereof, where $R^b$ to $R^d$ are independently hydrogen, a substituted or unsubstituted C1 to C10 alkyl group, a halogen atom, or a combination thereof.

The first compound may be a polymer having a weight average molecular weight of about 1,000 to about 30,000.

The second compound may be a compound including a moiety represented by Chemical Formula 2, a compound including a moiety represented by Chemical Formula 3, a compound including a moiety represented by Chemical Formula 4, or a combination thereof:

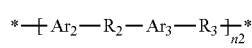

[Chemical Formula 2]

In Chemical Formula 2, $Ar_2$ and $Ar_3$ are independently a cyclic group including at least one substituted or unsubstituted benzene ring, $R_2$ and $R_3$ are independently a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, $n_2$ is an integer of 1 to 100, and * is a linking point,

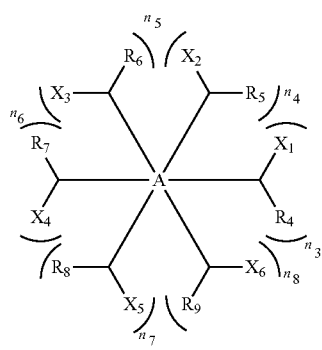

[Chemical Formula 3]

In Chemical Formula 3, A is a substituted or unsubstituted cyclic group, $R_4$ to $R_9$ may be independently a substituted or unsubstituted C1 to C10 alkyl group, a substituted or unsubstituted C6 to C30 aromatic ring group, a substituted or unsubstituted C3 to C20 cycloalkyl group, a substituted or unsubstituted C3 to C20 cycloalkenyl group, or a combination thereof, $X_1$ to $X_6$ may be independently hydrogen, a hydroxy group, a thionyl group, a thiol group, a cyano group, a substituted or unsubstituted amino group, a halogen atom, a substituted or unsubstituted C1 to C30 alkoxy group, or a combination thereof, $n_3$ to $n_8$ are independently integers of 0 to 6, and $1 \leq n_3+n_4+n_5+n_6+n_7+n_8 \leq 6$,

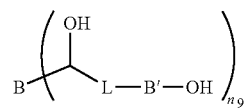

[Chemical Formula 4]

In Chemical Formula 4, B is a substituted or unsubstituted cyclic group, B' is a substituted or unsubstituted polycyclic aromatic group, L is a single bond or a substituted or unsubstituted C1 to C6 alkylene group, and $n_9$ is an integer ranging from 1 to 4.

In Chemical Formula 2, $Ar_2$ and $Ar_3$ may be independently selected from Group 1:

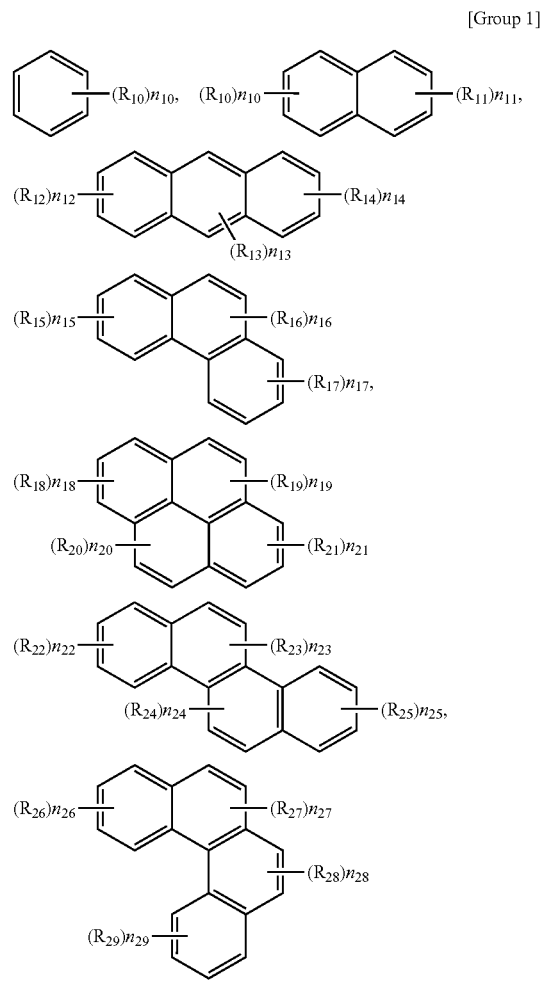

[Group 1]

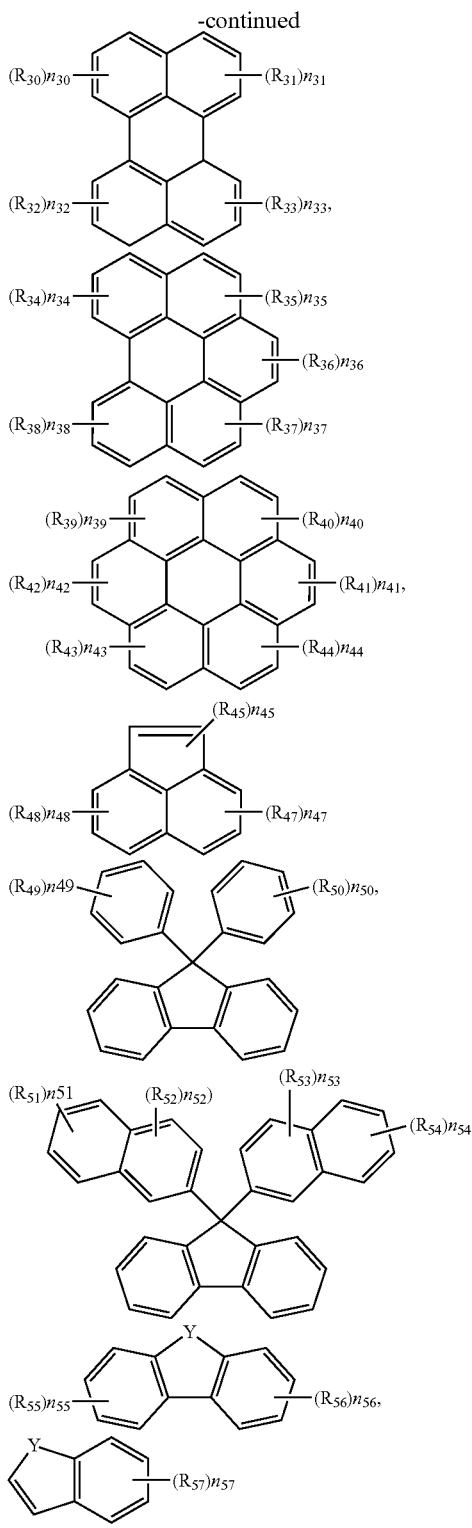

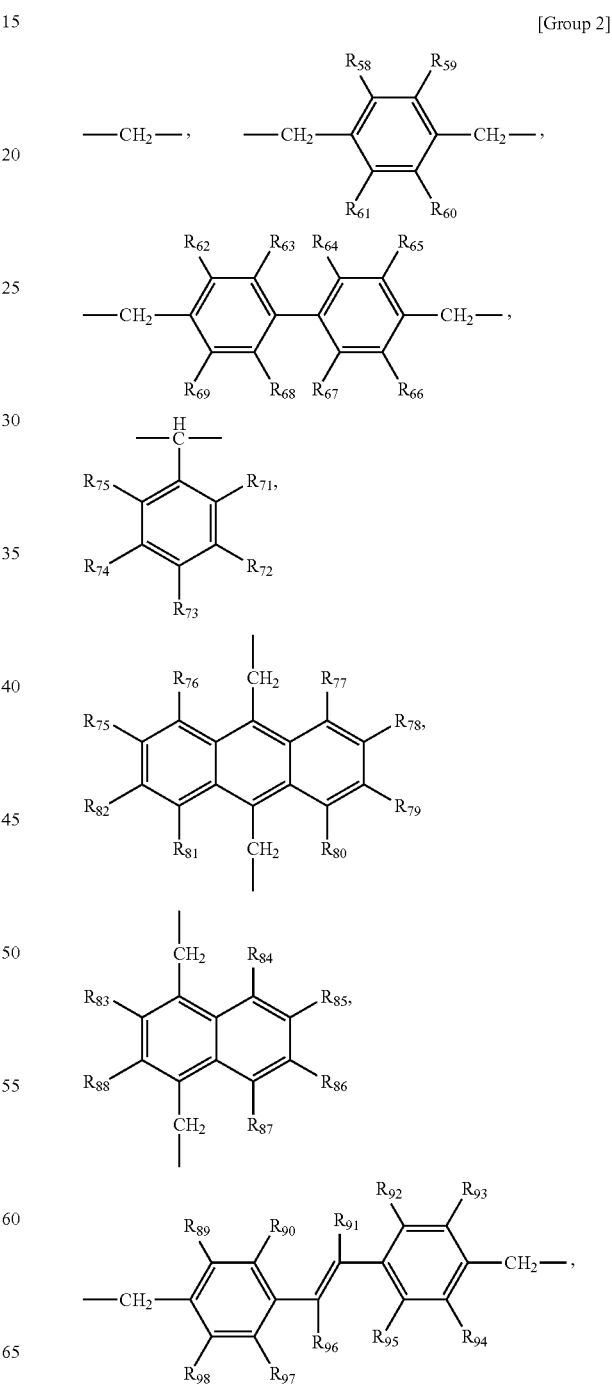

In Group 1, $R_{10}$ to $R_{45}$ and $R_{47}$ to $R_{57}$ are independently hydrogen, a hydroxy group, a halogen, a substituted or unsubstituted C1 to C30 alkyl group, a substituted or unsubstituted C3 to C30 cycloalkyl group, a substituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C20 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, $n_{10}$ to $n_{45}$ and $n_{47}$ to $n_{57}$ are independently integers of 1 to 6, and Y is C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof.

In Chemical Formula 2, $R_2$ and $R_3$ may be independently selected from Group 2:

[Group 2]

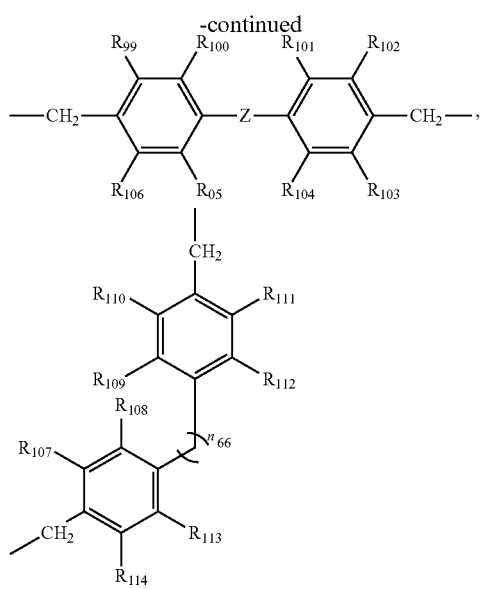

In Group 2, $R_{58}$ to $R_{114}$ are independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C20 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, $n_{66}$ is an integers of 0 to 30, and Z is C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof.

In Chemical Formula 3, A may be a cyclic group selected from Group 3, or a substituted cyclic group that is the cyclic group selected from Group 3 substituted with another substituent:

[Group 3]

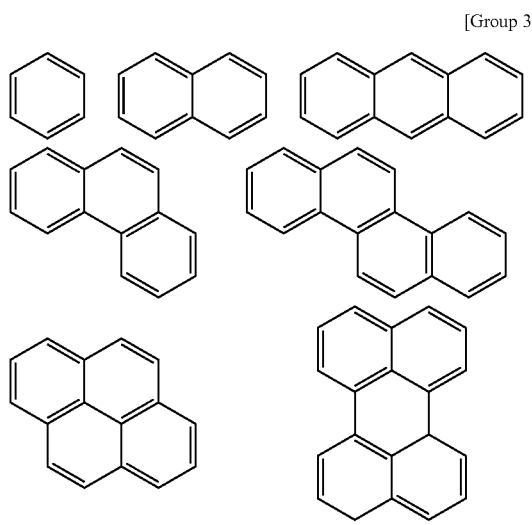

In Chemical Formula 4, B may be a cyclic group selected from Group 3, or a substituted cyclic group that is the cyclic group selected from Group 3 substituted with another substituent, and B' may be a pyrene group, a perylene group, a benzoperylene group, a coronene group, or a combination thereof:

[Group 3]

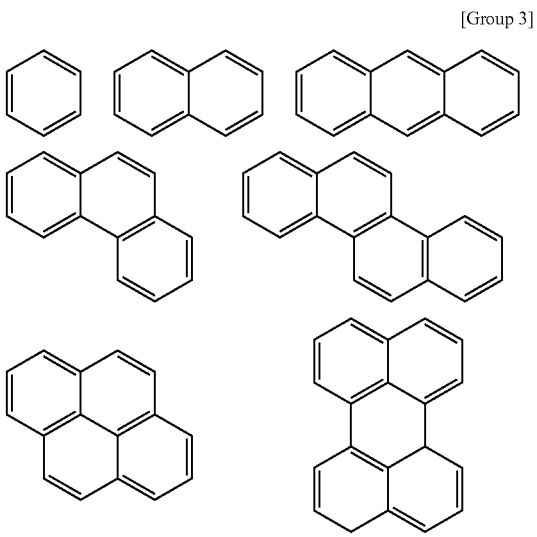

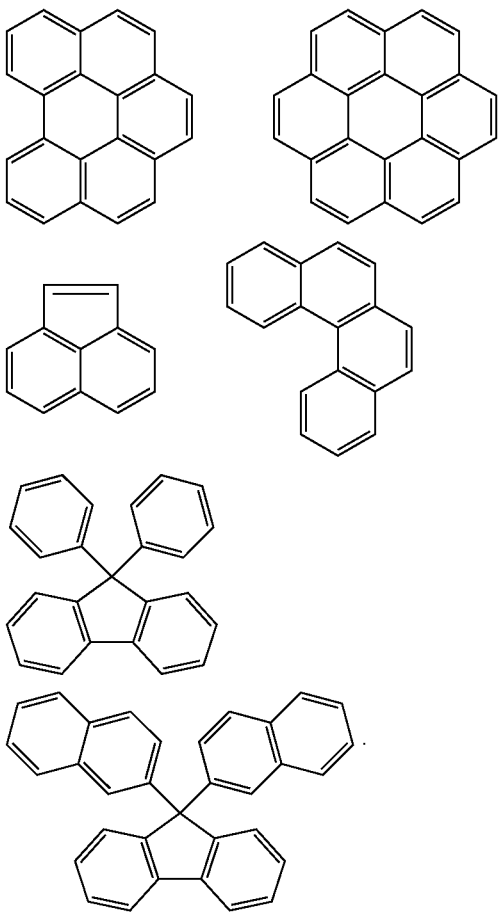

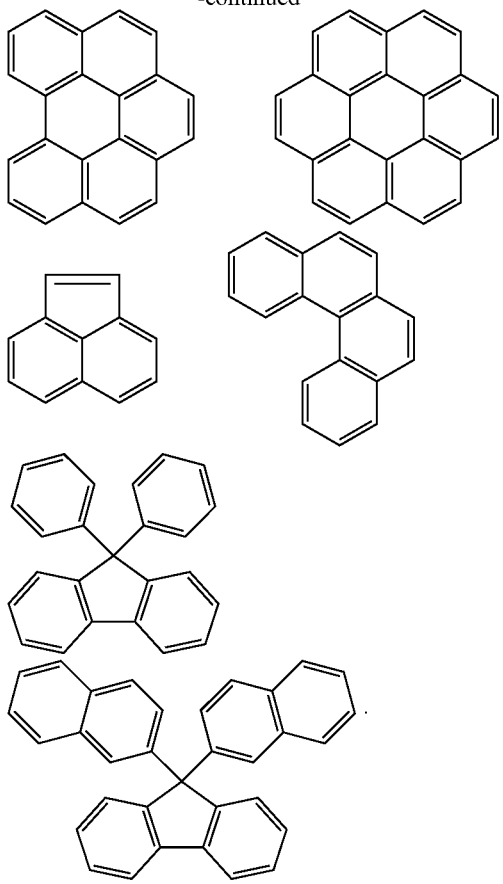

The compound represented by Chemical Formula 3 and the compound represented by Chemical Formula 4 may independently be a monomer having a molecular weight of about 500 to about 4,000.

The first compound and the second compound may be included in an amount of about 0.1 wt % to about 50 wt % based on the total amount of the organic layer composition.

Embodiments are also directed to an organic layer obtained by curing the organic layer composition as described above.

The organic layer may be a hardmask layer.

The method may include providing a material layer on a substrate, applying the organic layer composition as claimed in claim 1 on the material layer, heat-treating the organic layer composition to provide a hardmask layer, providing a silicon-containing thin layer on the hardmask layer, providing a photoresist layer on the silicon-containing thin layer, exposing and developing the photoresist layer to form a photoresist pattern, selectively removing the silicon-containing thin layer and the hardmask layer using the photoresist pattern to expose a part of the material layer, and etching an exposed part of the material layer.

The organic layer composition may be applied using a spin-on coating method.

The heat-treating may be performed at about 100° C. to about 500° C.

The method may further include providing a bottom antireflective coating (BARC) before providing the photoresist layer.

BRIEF DESCRIPTION OF THE DRAWINGS

Features will become apparent to those of skill in the art by describing in detail exemplary embodiments with reference to the attached drawings in which:

FIGS. 1 and 2 illustrate reference drawings for explaining Calculation Equation 2 to evaluate planarization characteristics.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. In the drawing figures, the dimensions of layers and regions may be exaggerated for clarity of illustration.

As used herein, when a definition is not otherwise provided, the term 'substituted' may refer to one substituted with a substituent selected from a halogen atom (F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C2 to C20 heteroaryl group, a C3 to C20 heteroarylalkyl group, a C3 to C30 cycloalkyl group, a C3 to C15 cycloalkenyl group, a C6 to C15 cycloalkynyl group, a C2 to C30 heterocycloalkyl group, and a combination thereof, instead of hydrogen of a compound.

As used herein, when a definition is not otherwise provided, the term 'hetero' refers to one including 1 to 3 heteroatoms selected from B, N, O, S, and P.

As used herein, when a definition is not otherwise provided, indicates a linking point of a compound or a moiety of a compound.

Hereinafter, an organic layer composition according to one embodiment is described.

An organic layer composition according to one embodiment may include a first compound having a predetermined thermal shrinkage ratio, a second compound having a smaller thermal shrinkage ratio than the first compound, and a solvent.

The organic layer composition may include at least two compounds (the first compound and the second compound) having different thermal shrinkage ratios.

The first compound may have a thermal shrinkage ratio of about 10% to about 70%. The thermal shrinkage ratio may be calculated by the following method.

[Method of Measuring a Thermal Shrinkage Ratio]

About 1 g of a compound is dissolved in about 10 g of propylene glycol monomethyl ether acetate (PGMEA) to prepare a composition. The composition is coated on a patterned substrate, the coated film thickness (Tk1) is measured at a cell portion and peri portion of the substrate, respectively. Then, the coated substrate is heat-treated at about 400° C. for about 2 minutes to provide a film, and a thickness (Tk2) of the film is measured at a cell portion and peri portion of the film, respectively. Then, each thermal shrinkage ratio (%) at a cell portion and peri portion of the film is obtained by Calculation Equation 1, respectively, and an arithmetic mean value thereof is regarded as a thermal shrinkage ratio of the compound. As shown in FIGS. 1 and 2, the cell portion is portion of the substrate where a pattern is formed, and a peri portion of a portion of the substrate where a pattern is not formed.

Thermal shrinkage ratio of compound=(coating film thickness($Tk1$)−film thickness after curing($Tk2$))/(coating film thickness($Tk1$))*100  [Calculation Equation 1]

The organic layer composition according to one embodiment may include the first compound having a thermal shrinkage ratio within the range of about 10% to about 70%, and the second compound having a smaller thermal shrinkage ratio than the first compound, simultaneously. For example, the thermal shrinkage ratio of the first compound may be about 20% to about 70% or about 10% to about 60%.

The first compound may be, for example, an organic compound including carbon cyclic group such as a benzene ring. The first compound may be, for example, an organic polymer including a carbon cyclic group.

For example, the first compound may be a compound including a moiety represented by Chemical Formula 1.

[Chemical Formula 1]

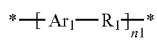

In Chemical Formula 1, $Ar_1$ is a cyclic group including at least one substituted or unsubstituted benzene ring, $R_1$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, $n_1$ is an integer of 1 to 100, and

* is a linking point.

For example, in Chemical Formula 1, $Ar_1$ may be selected from groups of Group 1.

[Group 1]

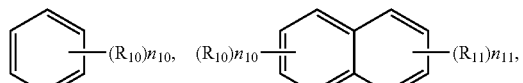

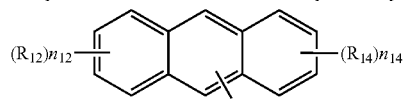

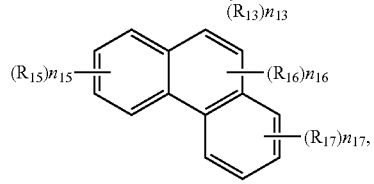

-continued

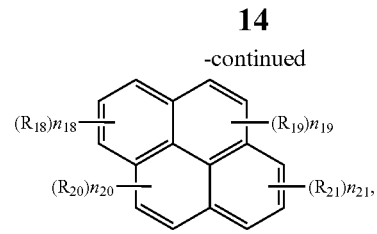

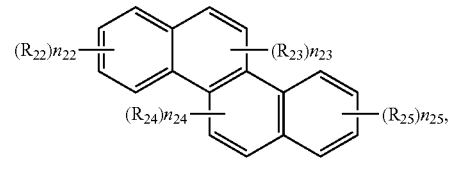

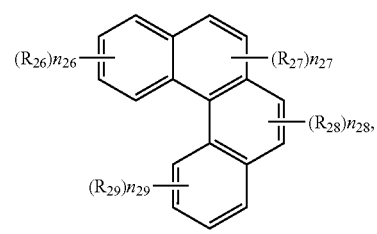

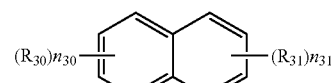

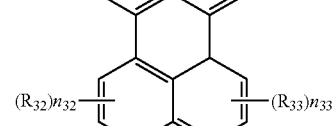

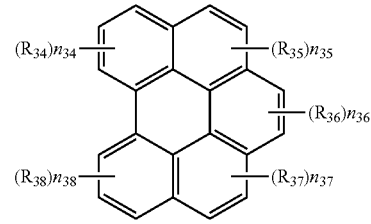

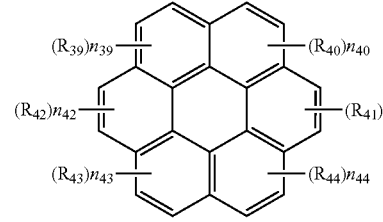

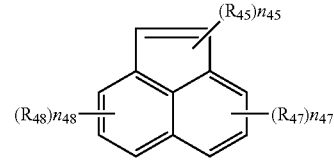

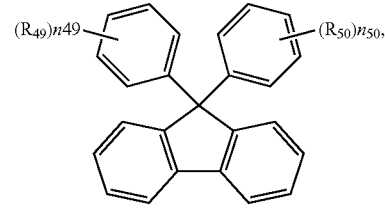

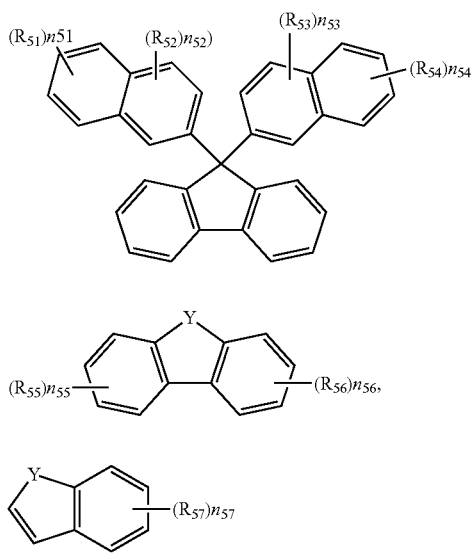

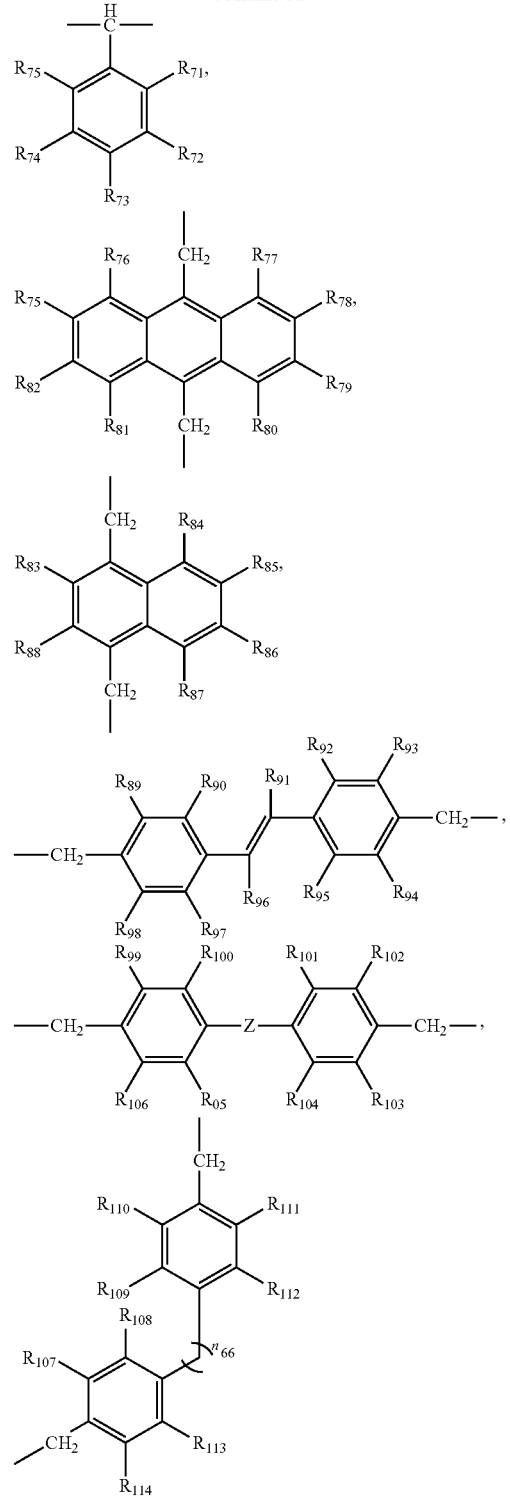

In Group 1, $R_{10}$ to $R_{45}$ and $R_{47}$ to $R_{57}$ are independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C20 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, $n_{10}$ to $n_{45}$ and $n_{47}$ to $n_{57}$ are independently an integer of 1 to 6, as further limited by the number of binding sites of the ring to which the respective one of $R_{10}$ to $R_{45}$ and $R_{47}$ to $R_{57}$ is attached and Y is C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof.

In Chemical Formula 1, $R_1$ may be selected, for example, from groups of Group 2.

[Group 2]

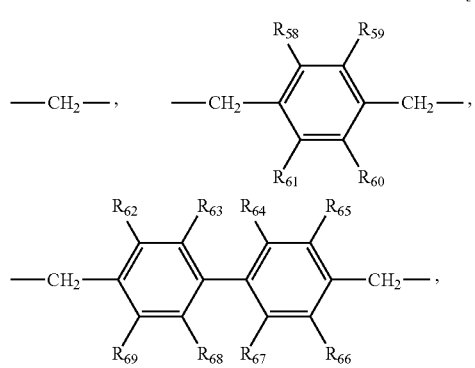

In Group 2, $R_{58}$ to $R_{114}$ are independently hydrogen, a hydroxy group, a halogen, a substituted or unsubstituted C1 to C30 alkyl group, a substituted or unsubstituted C3 to C30 cycloalkyle group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C20 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, $n_{66}$ is an integer of 0 to 30, and Z is C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof.

In Groups 1 and 2, linking points may be appropriately selected by a person of an ordinary skill in the art.

The first compound may include one or more kinds of compound having a predetermined thermal shrinkage ratio.

The second compound may include a compound including a moiety represented by Chemical Formula 2.

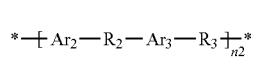

[Chemical Formula 2]

In Chemical Formula 2, $Ar_2$ and $Ar_3$ are independently a cyclic group including at least one substituted or unsubstituted benzene ring, $R_2$ and $R_3$ are independently a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof, $n_2$ is an integer of 1 to 100, and

* is a linking point.

For example, in Chemical Formula 2, $Ar_2$ and $Ar_3$ may independently be selected from the Group 1, and for example, $R_2$ and $R_3$ may independently be selected from Group 2, as examples.

The second compound may include a compound including a moiety represented by Chemical Formula 3.

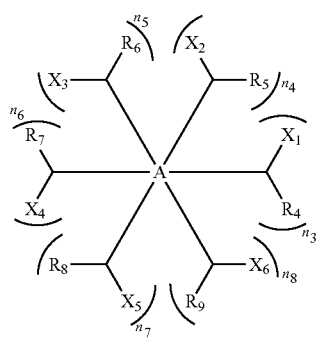

[Chemical Formula 3]

In Chemical Formula 3,

A is a substituted or unsubstituted cyclic group, $R_4$ to $R_9$ are independently substituted or unsubstituted C1 to C10 alkyl group, a substituted or unsubstituted C6 to C30 aromatic ring group, a substituted or unsubstituted C3 to C20 cycloalkyl group, a substituted or unsubstituted C3 to C20 cycloalkenyl group, or a combination thereof, $X_1$ to $X_6$ are independently hydrogen, a hydroxy group, thionyl group, thiol group, a cyano group, a substituted or unsubstituted amino group, a halogen atom, a substituted or unsubstituted C1 to C30 alkoxy group, or a combination thereof, $n_3$ to $n_8$ are independently integers of 0 to 6, and $1 \le n_3+n_4+n_5+n_6+n_7+n_8 \le 6$.

In Chemical Formula 3, A may be a cyclic group selected from Group 3, or a substituted cyclic group that is the cyclic group selected from Group 3 substituted with another substituent.

[Group 3]

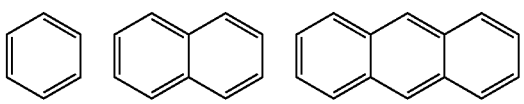

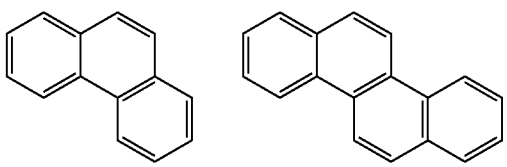

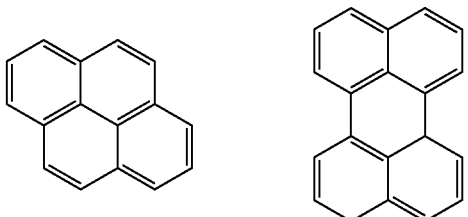

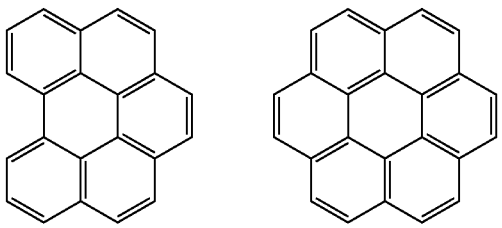

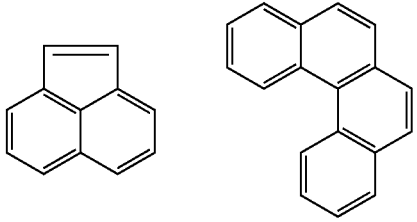

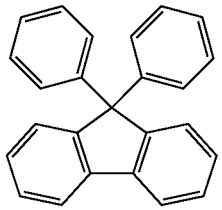

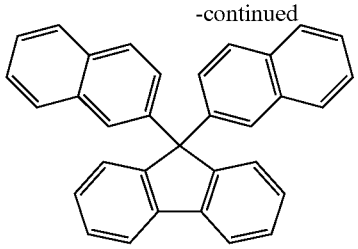

In Group 3, linking points are not particularly limited.

The second compound may include a compound including a moiety represented by Chemical Formula 4.

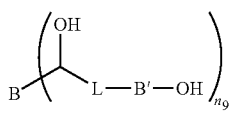

[Chemical Formula 4]

In Chemical Formula 4,

B is a substituted or unsubstituted cyclic group,

B' is a substituted or unsubstituted polycyclic aromatic group,

L is a single bond or a substituted or unsubstituted C1 to C6 alkylene group, $n_9$ is an integer ranging from 1 to 4.

In Chemical Formula 4, B may be a cyclic group selected from Group 3, or a substituted cyclic group that is the cyclic group selected from Group 3 substituted with another substituent, and B' may be, for example, a pyrene group, a perylene group, a benzoperylene group, a coronene group, or a combination thereof.

As described, as examples of the second compound, the compound represented by Chemical Formula 2, the compound represented by Chemical Formula 3 and the compound represented by Chemical Formula 4 are disclosed, but it is to be understood that the second compound may be a suitable compound that has smaller thermal shrinkage ratio than the first compound.

The second compound may include one or more kinds of compound having a smaller thermal shrinkage ratio than the first compound.

As described above, the organic layer composition simultaneously includes the first compound satisfying a predetermined thermal shrinkage ratio and the second compound having a smaller thermal shrinkage ratio than the first compound. Thus, the organic layer composition may satisfy performance desirable for an organic layer material used in a semiconductor process. For example, the organic layer composition may have excellent gap-fill characteristics of filling the gap of a pattern and excellent planarization characteristics and may also satisfy desirable mechanical properties of a film, such as etch resistance.

The first compound and the second compound may be included in the organic layer composition in a weight ratio of, for example, about 1:99 to 99:1, about 10:90 to 90:10, or about 20:80 to 80:20.

The first compound may be a polymer having a weight average molecular weight in a range of, for example, about 1,000 to about 30,000, and the second compound may be a polymer having a weight average molecular weight in a range of, for example, about 1,000 to about 30,000 or a monomer having a molecular weight in a range of, for example, about 500 to about 4,000.

The solvent of the organic layer composition may be a suitable solvent having sufficient dissolubility or dispersion for the first and second compounds. The solvent may be, for example, at least one selected from propylene glycol, propylene glycol diacetate, methoxy propanediol, diethylene glycol, diethylene glycol butylether, tri(ethylene glycol) monomethylether, propylene glycol monomethylether, propylene glycol monomethylether acetate, cyclohexanone, ethyl lactate, gamma-butyrolactone, N,N-dimethyl formamide, N,N-dimethyl acetamide, methylpyrrolidone, methylpyrrolidinone, acetylacetone, and ethyl 3-ethoxypropionate.

The first and second compounds may be present in an amount of about 0.1 to about 50 wt % or about 0.1 to about 30 wt % based on the total amount of the organic layer composition. When the first and second compounds are included in the range, a thickness, surface roughness and planarization of the organic layer may be controlled.

The organic layer composition may further include an additive such as a surfactant, a cross-linking agent, a thermal acid generator, a plasticizer, or the like.

The surfactant may include, for example, alkylbenzene sulfonate salt, alkyl pyridinium salt, polyethylene glycol, or a quaternary ammonium salt.

The cross-linking agent may be, for example, a melamine-based, a substituted urea-based, or a polymer-based agent thereof. For example, the cross-linking agent may have at least two cross-linking forming substituent and may be, for example, a compound such as methoxymethylated glycoluril, butoxymethylated glycoluril, methoxymethylated melamine, butoxymethylated melamine, methoxymethylated benzoguanamine, butoxymethylated benzoguanamine, methoxymethylated urea, butoxymethylated urea, methoxymethylated thiourea, or methoxymethylated thiourea, or the like.

The cross-linking agent may be a cross-linking agent having high heat resistance. The cross-linking agent having high heat resistance may be a compound including a cross-linking substituent including an aromatic ring (for example a benzene ring, or a naphthalene ring) in the molecule.

The thermal acid generator may be, for example an acidic compound such as p-toluenesulfonic acid, trifluoromethanesulfonic acid, pyridinium p-toluenesulfonic acid, salicylic acid, sulfosalicylic acid, citric acid, benzoic acid, hydroxybenzoic acid, naphthalenecarbonic acid or the like or/and 2,4,4,6-tetrabromocyclohexadienone, benzointosylate, 2-nitrobenzyltosylate, other organosulfonic acid alkylester, or the like.

The additive may be present in an amount of about 0.001 to about 40 parts by weight based on 100 parts by weight of the organic layer composition. When the additive is included within the range, solubility may be improved without changing optical properties of the organic layer composition.

According to another embodiment, an organic layer manufactured using the organic layer composition is provided. The organic layer may be formed, for example, by coating the organic layer composition on a substrate and heat-treating the coated composition for curing. The organic layer may be, for example, a hardmask layer, a planarization layer, a sacrificial layer, a filler, or the like, for an electronic device.

Hereafter, a method for forming a pattern by using the organic layer composition is described.

A method of forming pattern according to an embodiment includes providing a material layer on a substrate, applying the organic layer composition including the polymer and a solvent on the material layer, heat-treating the organic layer composition to provide a hardmask layer, providing a silicon-containing thin layer on the hardmask layer, providing a photoresist layer on the silicon-containing thin layer, exposing and developing the photoresist layer to form a photoresist pattern, selectively removing the silicon-containing thin layer and the hardmask layer using the photoresist pattern to expose a part of the material layer and etching an exposed part of the material layer.

The substrate may be, for example, a silicon wafer, a glass substrate, or a polymer substrate.

The material layer may be a material to be finally patterned, for example a metal layer such as an aluminum layer and a copper layer, a semiconductor layer such as a silicon layer, or an insulation layer such as a silicon oxide layer and a silicon nitride layer. The material layer may be formed through a method such as a chemical vapor deposition (CVD) process.

The organic layer composition is the same as described above. The organic layer composition may be applied by spin-on coating in a form of a solution. Herein, a thickness of the organic layer composition may be, for example, about 50 Å to about 10,000 Å.

Heat-treating of the organic layer composition may be performed, for example, at about 100 to about 500° C. for about 10 seconds to 1 hour.

The silicon-containing thin layer may be formed of, for example, a material such as SiCN, SiOC, SiON, SiOCN, SiC and/or SiN or the like.

The method may further include forming a bottom anti-reflective coating (BARC) before forming the photoresist layer on the silicon-containing thin layer.

Exposure of the photoresist layer may be performed using, for example, ArF, KrF, or EUV. After exposure, heat treatment may be performed at about 100° C. to about 500° C.

The etching process of the exposed part of the material layer may be performed through a dry etching process using an etching gas. The etching gas may be, for example, $CHF_3$, $CF_4$, $Cl_2$, $BCl_3$, or a mixed gas thereof.

The etched material layer may be formed in a plurality of patterns, The plurality of pattern may be a metal pattern, a semiconductor pattern, an insulation pattern, or the like. For example, the etched material layer may be one of various diverse patterns of a semiconductor integrated circuit device.

The following Synthesis Examples, Examples, and Comparative Examples are provided in order to highlight characteristics of one or more embodiments, but it will be understood that the Synthesis Examples, Examples, and Comparative Examples are not to be construed as limiting the scope of the embodiments, nor are the Comparative Examples to be construed as being outside the scope of the embodiments. Further, it will be understood that the embodiments are not limited to the particular details described in the Synthesis Examples, Examples, and Comparative Examples.

SYNTHESIS EXAMPLE

Synthesis Examples 1-1 to 1-3

Synthesis of First Compound

Synthesis Example 1-1

A 500 ml 3-neck flask equipped with a thermometer, a condenser, and a mechanical stirrer was dipped in a 90 to 100° C. oil thermostat. This thermostat was put on a hot plate and then stirred with a magnetic stirrer while maintained at the same temperature. Herein, cooling water in the condenser was set at 5° C.

Subsequently, 28.83 g (0.2 mol) of 2-naphthol and 12.08 g (0.34 mol) of paraformaldehyde were put into the 3-necked flask. Subsequently, a solution obtained by dissolving 0.57 g (3 mmol) of p-toluene sulfonic acid monohydrate in 163 g of propylene glycol monomethyl ether acetate (PGMEA) was put into the 3-necked flask, and the mixture was stirred for 15 to 20 hours to perform a reaction.

When a specimen taken from the polymerization reactant every one hour had a weight average molecular weight in a range of 1,500 to 2,000, the reaction was considered as completed. Herein, the weight average molecular weight was measured by taking 1 g of the specimen from the polymerization reactant, rapidly quenching it down to room temperature, and then, taking 0.02 g from the specimen and diluting it to have a solid of 4 wt % with tetrahydrofuran (THF) as a solvent.

When the polymerization reaction was complete, the reactant was slowly cooled down to room temperature. The reactant was added to 40 g of distilled water and 400 g of methanol, and the mixture was fervently stirred and allowed to stand. After removing a supernatant therefrom, a precipitate therein was dissolved in 80 g of propylene glycol monomethyl ether acetate (PGMEA), and the solution was fervently stirred by using 320 g of methanol and allowed to stand (first process). Then, a supernatant obtained therefrom was removed again, and a precipitate therein was dissolved in 80 g of propylene glycol monomethyl ether acetate (PGMEA) (second process). The first and second processes were regarded as one purification process, and this purification process was repeated three times. The purified polymer was dissolved in 80 g of propylene glycol monomethyl ether acetate (PGMEA), and methanol and distilled water remaining in the solution were removed under a reduced pressure, obtaining a compound represented by Chemical Formula 1a.

The compound had a weight average molecular weight of 1,950 and polydispersity of 1.38.

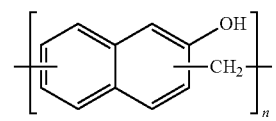

[Chemical Formula 1a]

Synthesis Example 1-2

A compound represented by Chemical Formula 1b was polymerized according to the same method as Synthesis Example 1-1 except for using 18.8 g (0.2 mol) of phenol, 12.08 g (0.34 mol) of paraformaldehyde, and 0.58 g (3 mmol) of p-toluene sulfonic acid monohydrate.

The compound had a weight average molecular weight of 3,150 and polydispersity of 1.88.

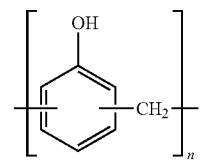

[Chemical Formula 1b]

Synthesis Example 1-3

A compound represented by Chemical Formula 1c was polymerized according to the same method as Synthesis Example 1-1 except for using 43.6 g (0.2 mol) of 1-hydroxypyrene, 12.08 g (0.34 mol) of paraformaldehyde, and 0.58 g (3 mmol) of p-toluene sulfonic acid monohydrate.

The compound had a weight average molecular weight of 2100 and polydispersity of 1.41.

[Chemical Formula 1c]

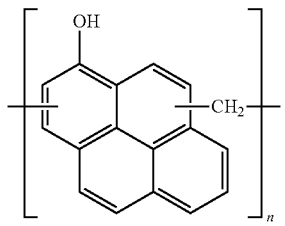

Synthesis Examples 2 to 5

Synthesis of Second Compound

Synthesis Example 2

450.5 g (1.0 mol) of 9,9'-bishydroxynaphthylfluorene and 3.1 g (0.02 mol) of diethylsulfate were added to 250 g of propylene glycolmonomethyl ether acetate (PGMEA) and sufficiently dissolved therein while the mixture was stirred in a reactor set at 100° C.

After about 10 minutes, 166.4 g (1.0 mol) of 1,4-bismethoxymethylbenzene was added thereto in a dropwise fashion, and the mixture was heated up to 120° C. and polymerized for 14 hours.

Then, a compound represented by Chemical Formula 2a was obtained by measuring a molecular weight by every hour and performing a purification process in the same method as Synthesis Example 1-1. The compound had a weight average molecular weight of 1,800 and polydispersity of 1.41.

[Chemical Formula 2a]

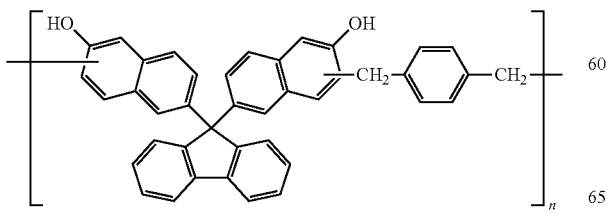

Synthesis Example 3

65.48 g (0.3 mol) of 1-hydroxypyrene and 103.12 g (1.0 mol) of 9,9'-bisphenolfluorene were added to 270.34 g of propylene glycolmonomethyl ether acetate (PGMEA), preparing a solution. Subsequently, 4.62 g (0.05 mol) of diethylsulfate was added to the solution, 199.48 g (2.0 mol) of 1,4-bismethoxymethylbenzene was added thereto in a dropwise fashion, and the resulting mixture was heated up to 130° C. and polymerized for 21 hours.

Then, a compound represented by Chemical Formula Chemical Formula 3a was obtained by measuring a molecular weight and performing purification by every one hour according to the same method as Synthesis Example 1. The compound had a weight average molecular weight of 2,100 and polydispersity of 1.68.

[Chemical Formula 3a]

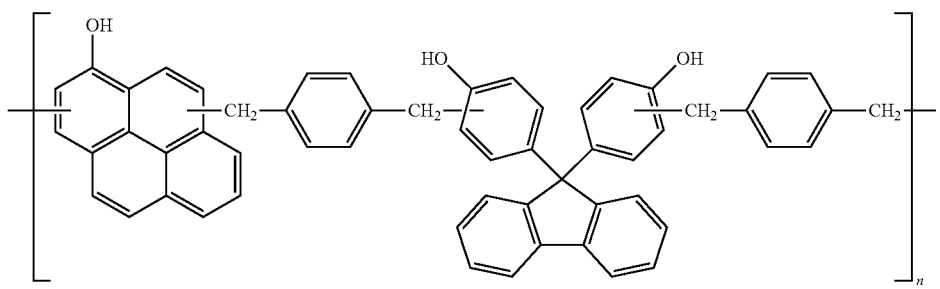

Synthesis Example 4

A flask was dipped in a 90° C. oil thermostat. Then, 30.6 g (0.1 mol) of 1-hydroxymethylbenzoperylene, 57.19 g (0.3 mol) of 2-naphthoyl chloride, 79.8 g (0.6 mol) of trichloro aluminum, and 1 L dichloromethane were put in the flask and then, stirred and reacted for 10 hours.

Then, the trichloro aluminum was removed by using water to obtain a compound, 37.83 g (1.0 mol) of sodium borohydride was added thereto, and the mixture was reacted for 17 hours.

When the reaction was complete, a by-product from the reaction was removed by using water/methanol mixture, obtaining a compound represented by Chemical Formula 4a. The compound had a weight average molecular weight of 770 and polydispersity of 1.19.

[Chemical Formula 4a]

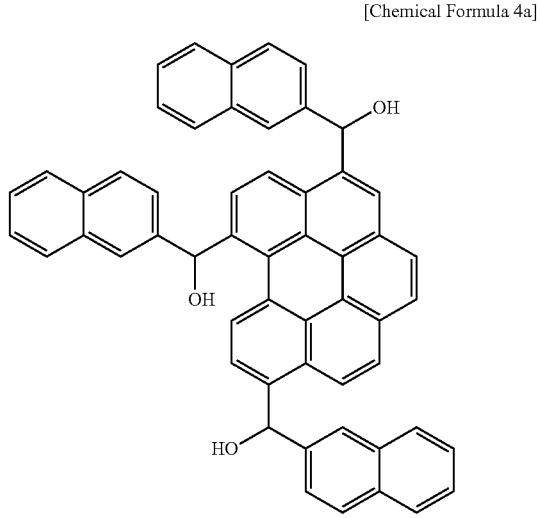 [SMILES: OC(c1ccc2ccccc2c1)c1ccc2c3c(C(O)c4ccc5ccccc5c4)ccc4c(C(O)c5ccc6ccccc6c5)cc5ccc6ccc1c2c6c5c43]

Synthesis Example 5

First Step: Friedel-Craft Acylation Reaction 20.6 g (0.101 mol) of terephthaloyl chloride, 47.0 g (0.203 mol) of 4-methoxypyrene, and 221 g of 1,2-dichloroethane were put in a flask, preparing a solution. Subsequently, 27 g (0.203 mol) of aluminum chloride was slowly added to the solution at room temperature, and the mixture was heated up to 60° C. and stirred for 8 hours. When the reaction was complete, a precipitate formed by adding methanol to the solution was filtered, obtaining bis(methoxypyrenylcarbonyl)benzene.

Second Step: Demethylation Reaction 53.5 g (0.0900 mol) of the bis(methoxypyrenylcarbonyl)benzene obtained in the first step, 91.1 g (0.450 mol) of 1-dodecanethiol, 30.3 g (0.540 mol) of potassium hydroxide, and 262 g of N,N-dimethylformamide were put in a flask and stirred at 120° C. for 8 hours. Subsequently, the mixture is cooled down and neutralized into pH 7 or so with a 5% hydrogen chloride solution, and a precipitate formed therein was filtered, obtaining bis(hydroxypyrenylcarbonyl)benzene.

Third Step: Reduction Reaction 24.0 g (0.0424 mol) of the bis(hydroxypyrenylcarbonyl)benzene obtained in the second step and 160 g of tetrahydrofuran were put in a flask, preparing a solution. 16.0 g (0.424 mol) of the sodium borohydride aqueous solution was slowly added to the solution, and the mixture was stirred at room temperature for 24 hours. When the reaction was complete, the resultant was neutralized into pH 7 or so with a 5% hydrogen chloride solution and extracted with ethyl acetate, obtaining a compound represented by Chemical Formula 5a.

[Chemical Formula 5a]

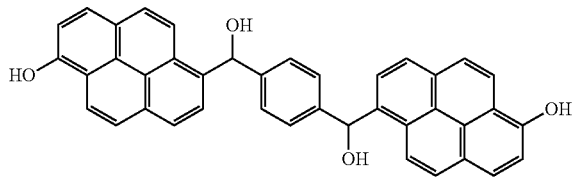

Measurement of Thermal Shrinkage Ratio

The compounds according to Synthesis Examples 1-1 to 1-3 and Synthesis Examples 2 to 5 were measured regarding a thermal shrinkage ratio by the following method.

One g of each compound according to Synthesis Examples 1-1 to 1-3 and Synthesis Examples 2 to 5 was dissolved in 10 g of propylene glycol monomethyl ether acetate (PGMEA), the solution was coated on a patterned substrate, and the thickness (Tk1) of the coated film was measured at each cell portion and peri portion. Then, the coated substrate was baked at 400° C. for 2 minutes, and the thickness (Tk2) of the baked film was measured at the cell portion and the peri portion.

Each thermal shrinkage ratio (%) at the cell portion and the peri portion was calculated according to Calculation Equation 1 and averaged.

Thermal shrinkage ratio of compound=(Thickness of coated film−Thickness of cured film)/Thickness of the coated film*100  [Calculation Equation 1]

The results are provided in the following Table 1.

TABLE 1

| | Thermal shrinkage ratio of compound (%) |
|---|---|
| Synthesis Example 1-1 (Chemical Formula 1a) | 47% |
| Synthesis Example 1-2 (Chemical Formula 1b) | 56.5% |
| Synthesis Example 1-3 (Chemical Formula 1c) | 35.5% |
| Synthesis Example 2 (Chemical Formula 2a) | 25% |
| Synthesis Example 3 (Chemical Formula 3a) | 28.5% |
| Synthesis Example 4 (Chemical Formula 4a) | 30.5% |
| Synthesis Example 5 (Chemical Formula 5a) | 35 |

Preparation of Hardmask Composition

Comparative Example 1

The compound represented by Chemical Formula 1a was dissolved in a mixed solvent of propylene glycol monomethylether acetate (PGMEA) and cyclohexanone (7:3 (v/v)) and then, filtered, preparing a hardmask composition. The resin was adjusted in a weight range of 5.0 wt % to 15.0 wt % based on the total weight of the hardmask composition depending on a desired thickness.

Comparative Example 2

The compound represented by Chemical Formula 2a was dissolved in a mixed solvent of propylene glycol monomethylether acetate (PGMEA) and cyclohexanone (7:3 (v/v)) and then, filtered, preparing a hardmask composition. The resin was adjusted in a weight range of 5.0 wt % to 15.0 wt % based on the total weight of the hardmask composition based on a desired thickness.

Example 1

The compound represented by Chemical Formula 1a, as the first compound, and the compound represented by Chemical Formula 2a, as the second compound, were mixed in a weight ratio of 70:30 and then, dissolved in a mixed solvent of propylene glycol monomethylether acetate (PGMEA) and cyclohexanone (7:3 (v/v)) and then, filtered, preparing a hardmask composition. The resin was adjusted in a weight range of 5.0 wt % to 15.0 wt % based on the total weight of the hardmask composition depending on a desired thickness.

Example 2

A hardmask composition was prepared according to the same method as Example 1 except for mixing the first compound (represented by Chemical Formula 1a) and the second compound (represented by Chemical Formula 2a) in a weight ratio of 50:50.

Example 3

A hardmask composition was prepared according to the same method as Example 1 except for mixing the first compound (represented by Chemical Formula 1a) and the second compound (represented by Chemical Formula 2a) in a weight ratio of 30:70.

Example 4

A hardmask composition was prepared according to the same method as Example 1 except for mixing the compound represented by Chemical Formula 1b, as the first compound, and the compound represented by Chemical Formula 3a, as the second compound, in a weight ratio of 70:30.

Example 5

A hardmask composition was prepared according to the same method as Example 1 except for mixing the first compound (represented by Chemical Formula 1b) and the second compound (represented by Chemical Formula 3a) in a weight ratio of 50:50.

Example 6

A hardmask composition was prepared according to the same method as Example 1 except for mixing the first compound (represented by Chemical Formula 1b) and the second compound (represented by Chemical Formula 3a) in a weight ratio of 30:70.

Example 7

A hardmask composition was prepared according to the same method as Example 1 except for mixing the compound represented by Chemical Formula 1c, as the first compound, and the compound represented by Chemical Formula 4a, as the second compound, in a weight ratio of 50:50.

Example 8

A hardmask composition was prepared according to the same method as Example 1 except for mixing the compound represented by Chemical Formula 1c, as the first compound and the second compound represented by Chemical Formula 5a, as the second compound, in a weight ratio of 50:50.

The hardmask compositions according to Comparative Examples 1 and 2 and Examples 1 to 8 are provided in Table 2.

TABLE 2

| | First compound | | Second compound | |
|---|---|---|---|---|
| | Compound | Amount (weight ratio) | Compound | Amount (weight ratio) |
| Comp. Ex. 1 | Chemical Formula 1a | 100 | Chemical Formula 2a | 0 |
| Comp. Ex. 2 | Chemical Formula 1a | 0 | Chemical Formula 2a | 100 |
| Ex. 1 | Chemical Formula 1a | 70 | Chemical Formula 2a | 30 |
| Ex. 2 | Chemical Formula 1a | 50 | Chemical Formula 2a | 50 |
| Ex. 3 | Chemical Formula 1a | 30 | Chemical Formula 2a | 70 |
| Ex. 4 | Chemical Formula 1b | 70 | Chemical Formula 3a | 30 |
| Ex. 5 | Chemical Formula 1b | 50 | Chemical Formula 3a | 50 |
| Ex. 6 | Chemical Formula 1b | 30 | Chemical Formula 3a | 70 |
| Ex. 7 | Chemical Formula 1c | 50 | Chemical Formula 4a | 50 |
| Ex. 8 | Chemical Formula 1c | 50 | Chemical Formula 5a | 50 |

Evaluation

Evaluation 1

Gap-Fill Characteristics

Each hardmask composition (a solid content: 10 wt %) according to Comparative Examples 1 and 2 and Examples 1 to 8 was spin-on coated onto a patterned silicon wafer and heat-treated at 400° C. for 2 minutes. and A cross-section of the pattern was examined with a scanning electron microscope (V-SEM) to see whether a void was generated.

When the composition was completely filled inside the pattern without a void, the composition was evaluated as "satisfactory," When was a void was present inside the pattern, the composition was evaluated as "defective."

Evaluation 2

Planarization Characteristics

Each hardmask composition (a solid content: 10 wt %) according to Comparative Examples 1 and 2 and Examples 1 to 8 was spin-on coated onto a patterned silicon wafer and heat-treated at 400° C. for 2 minutes. The planarization characteristics of the thin film were evaluated with a scanning electron microscope (V-SEM).

Herein, as a difference between the peri portion and the cell portion in the thin film, that is, a step, is smaller, planarization characteristics are considered to be excellent. The step is calculated according to Calculation Equation 2.

$$\text{Step} = \text{Thickness in peri portion}(h1) - \text{Thickness in the center of cell}(h2) \quad \text{[Calculation Equation 2]}$$

Referring to FIGS. 1 and 2, a method of evaluating the planarization characteristics is further illustrated. FIGS. 1 and 2 are reference views illustrating Calculation Equation 2 for evaluation of the planarization characteristics (a step).

Referring to FIG. 1, the film thickness (h1) in the peri portion where the pattern was not formed was thicker than the film thickness (h2) in the center of the cell. Herein, the thin film had a positive (+) difference (h1−h2). When the difference has a small absolute value, the thin film is considered to have excellent planarization characteristics.

Referring to FIG. 2, the thin film had a smaller thickness (h1) in the peri portion wherein a pattern was not formed than the thin film thickness (h2) in the center of the cell. Herein, the difference (h1−h2) of the thin film was negative (−). When the difference has a smaller absolute value, planarization characteristics are considered to be excellent.

Evaluation 3

Etch Resistance

Each hardmask composition (a solid content: 10 wt %) according to Comparative Examples 1 and 2 and Examples 1 to 8 was spin-on coated onto a silicon wafer and heat-treated at 400° C. for 2 minutes to form a thin film. The thickness of the thin film was measured by using a thin-film thickness measuring instrument made by K-MAC.

Subsequently, the thin film was dry-etched for 100 seconds with CFx mixed gas, the thickness of the thin film was measured, and then, the etch resistance of the thin film was evaluated by calculating a bulk etch rate (BER) according to Calculation Equation 3.

When an etching speed was less than or equal to 120 nm/min, the etch resistance was evaluated as A, and when the etching speed was greater than or equal to 120 nm/min, the etch resistance was evaluated as B.

Bulk etch rate(BER)=(Initial thickness of thin film−Thickness of thin film after etching)/etching time (nm/min)  [Calculation Equation 3]

The results of Evaluations 1 to 3 are provided in Table 3.

TABLE 3

|  | Gap-fill | Step (Å) | Etch resistance |
|---|---|---|---|
| Comparative Example 1 | Good | −250 | B |
| Comparative Example 2 | Inferior | +200 | A |
| Example 1 | Good | −100 | A |
| Example 2 | Good | −25 | A |
| Example 3 | Good | +150 | A |
| Example 4 | Good | −70 | A |
| Example 5 | Good | +15 | A |
| Example 6 | Good | +100 | A |
| Example 7 | Good | +30 | A |
| Example 8 | Good | +65 | A |

Referring to Table 3, each thin film respectively formed of the hardmask compositions according to Examples 1 to 8 showed no void generation and thus had satisfactory gap-fill characteristics, but a thin film formed of the hardmask composition according to Comparative Example 2 showed a void generation.

In addition, each thin film respectively formed of the hardmask compositions according to Examples 1 to 8 had a step absolute value in a range of less than or equal to 150 Å, while each thin film respectively formed of the hardmask compositions according to Comparative Examples 1 and 2 had a step absolute value in a range of greater than or equal to 200 Å. Accordingly, each thin film respectively formed of the hardmask compositions according to Examples 1 to 8 showed excellent planarization characteristics compared with each thin film respectively formed of the hardmask compositions according to Comparative Examples 1 and 2.

In addition, each thin film respectively formed of the hardmask compositions according to Examples 1 to 8 showed excellent etch resistance compared with each thin film respectively formed of the hardmask compositions according to Comparative Examples 1 and 2.

By way of summation and review, a typical lithographic technique includes providing a material layer on a semiconductor substrate, coating a photoresist layer thereon, exposing and developing the same to provide a photoresist pattern, and etching the material layer using the photoresist pattern as a mask.

According to small-sizing the pattern to be formed, it may be difficult to provide a fine pattern having an excellent profile by only above-mentioned typical lithographic technique. Accordingly, a layer, called a hardmask layer, may be formed between the material layer and the photoresist layer to provide a fine pattern.

The hardmask layer may act as an intermediate layer for transferring the fine pattern of photoresist to the material layer through the selective etching process. Accordingly, it is desirable that the hardmask layer have characteristics such as heat resistance and etch resistance, or the like to be tolerated during the multiple etching processes.

It has been recently suggested to form a hardmask layer by a spin-on coating method instead of by chemical vapor deposition. The spin-on coating method is easy to perform and may also improve gap-fill characteristics and planarization characteristics. Gap-fill characteristics of filling the patterns without a void are desirable, since the fine pattern may be realized by necessarily forming multi patterns. In addition, the surface of the hardmask layer may need to be planarized by an underlayer when a substrate has a step, or when a pattern-close region and no pattern region are present together on a wafer.

Accordingly, an organic layer material having excellent pattern fill characteristics and planarization characteristics as well as securing mechanical properties is desirable.

Embodiments provide an organic layer composition having improved gap-fill characteristics and planarization characteristics while providing suitable etch resistance.

Embodiments also provide an organic layer satisfying mechanical characteristics and planarization characteristics simultaneously.

Embodiments provide a method of forming a pattern using the organic layer composition.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope thereof as set forth in the following claims.

What is claimed is:

1. An organic layer composition, consisting essentially of a first compound, a second compound, and a solvent,
the first compound having a thermal shrinkage ratio of about 10% to about 70%, wherein the first compound includes a moiety represented by Chemical Formula 1:

[Chemical Formula 1]

$$*\!-\!\!\left[\!Ar_1\!-\!R_1\!\right]_{n_1}\!\!-\!*$$

wherein, in Chemical Formula 1,
$Ar_1$ is selected from Group 1:

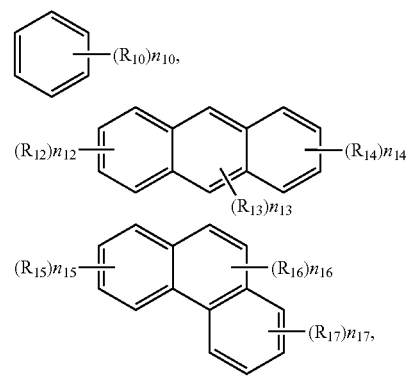

[Group 1]

-continued

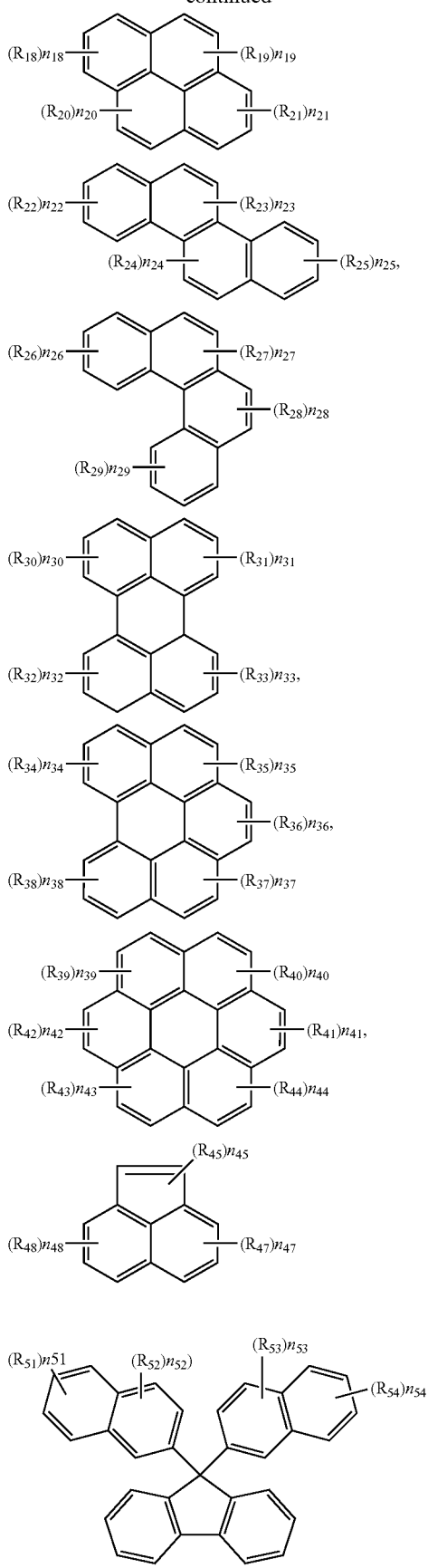

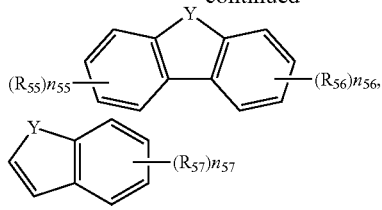

wherein, in Group 1,
  $R_{10}$ to $R_{45}$ and $R_{47}$ to $R_{57}$ are independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C20 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof,
  $n_{10}$ to $n_4$; and $n_{47}$ to $n_{57}$ are independently integers of 1 to 6, as further limited by the number of binding sites of the ring to which the respective one of $R_{10}$ to $R_{45}$ and $R_{47}$ to $R_{57}$ is attached, and
  Y is C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof
  $R_1$ is a single bond, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 cycloalkenylene group, a substituted or unsubstituted C7 to C20 arylalkylene group, a substituted or unsubstituted C1 to C20 heteroalkylene group, a substituted or unsubstituted C2 to C30 heterocycloalkylene group, a substituted or unsubstituted C2 to C30 heteroarylene group, a substituted or unsubstituted C2 to C30 alkenylene group, a substituted or unsubstituted C2 to C30 alkynylene group, or a combination thereof,
  $n_1$ is an integer of 1 to 100, and
  is a linking point; and
  the second compound having a smaller thermal shrinkage ratio than the first compound, wherein the second compound is a compound represented by Chemical Formula 3, a compound represented by Chemical Formula 4, or a combination thereof:

[Chemical Formula 3]

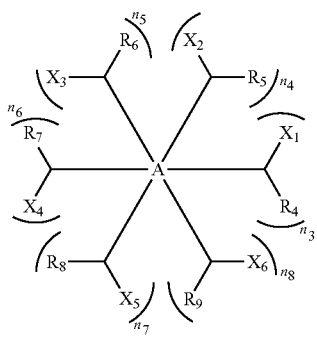

wherein, in Chemical Formula 3,

A is a cyclic group selected from Group 3, or a substituted cyclic group that is the cyclic group selected from Group 3 substituted with another substituent:

[Group 3]

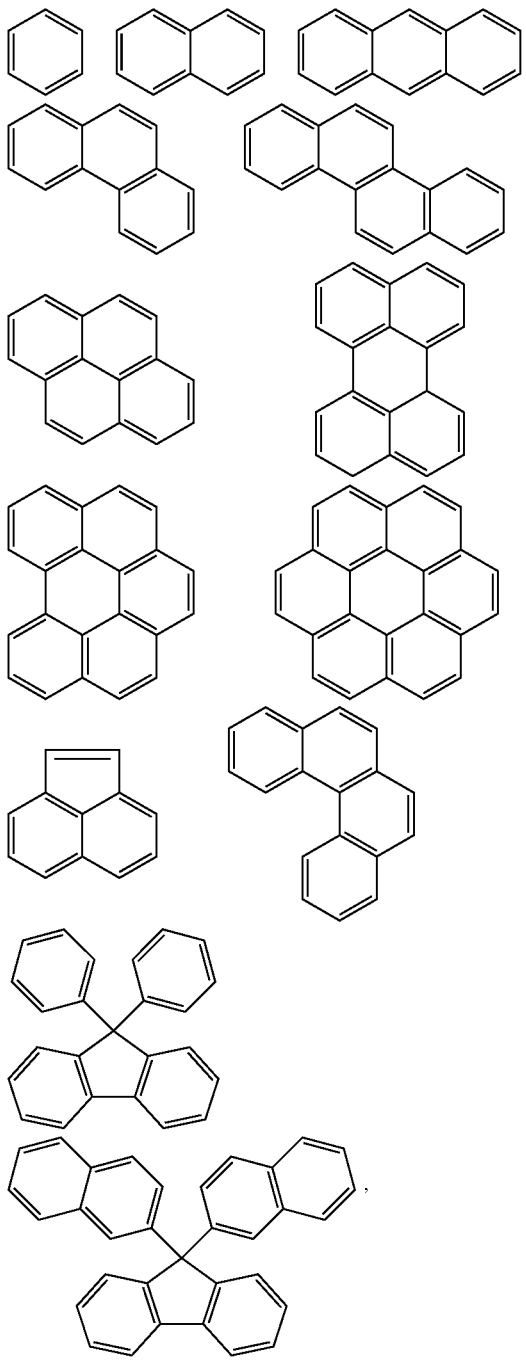

$R_4$ to $R_9$ are independently a substituted or unsubstituted C1 to C10 alkyl group, a substituted or unsubstituted C6 to C30 aromatic ring group, a substituted or unsubstituted C3 to C20 cycloalkyl group, a substituted or unsubstituted C3 to C20 cycloalkenyl group, or a combination thereof, $X_1$ to $X_6$ are independently hydrogen, a hydroxy group, a thionyl group, a thiol group, a cyano group, a substituted or unsubstituted amino group, a halogen atom, a substituted or unsubstituted C1 to C30 alkoxy group, or a combination thereof, $n_3$ to $n_8$ are independently integers of 0 to 6, and $2 \leq n_3+n_4+n_5+n_6+n_7+n_8 \leq 6$,

[Chemical Formula 4]

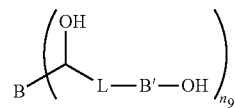

wherein, in Chemical Formula 4,

B is a substituted or unsubstituted cyclic group,

B' is a substituted or unsubstituted polycyclic aromatic group,

L is a single bond or a substituted or unsubstituted C1 to C6 alkylene group, and $n_9$ is an integer ranging from 1 to 4, wherein the first compound and the second compound are included in a weight ratio of about 50:50 to about 99:1, and wherein the thermal shrinkage ratio of a compound is calculated by the following method: Method of Measuring a Thermal Shrinkage Ratio as defined in the specification:

[Method of measuring a thermal shrinkage ratio]

about 1 g of a compound is dissolved in about 10 g of propylene glycol monomethyl ether acetate (PGMEA) to prepare a composition, the composition is coated on a patterned substrate, the coated film thickness (Tk1) is measured at a cell portion and peri portion of the substrate, respectively, the coated substrate is heat-treated at about 400° C. for about 2 minutes to provide a film, and a thickness (Tk2) of the film is measured at a cell portion and peri portion of the film, respectively, and each thermal shrinkage ratio (%) at a cell portion and peri portion of the film is obtained by Calculation Equation 1, respectively, and an arithmetic mean value thereof is regarded as a thermal shrinkage ratio of the compound:

Thermal shrinkage ratio of compound=(coating film thickness(*Tk*1)–film thickness after curing(*Tk*2))/(coating film thickness(*Tk*1))*100.   [Calculation Equation 1]

2. The organic layer composition as claimed in claim 1, wherein the thermal shrinkage ratio of the first compound is about 10% to about 60%.

3. The organic layer composition as claimed in claim 1, wherein in Chemical Formula 1, $R_1$ is selected from Group 2:

[Group 2]

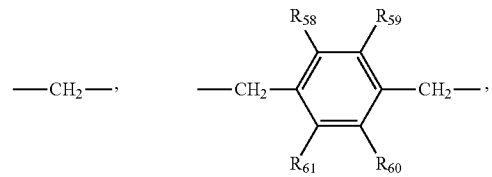

-continued

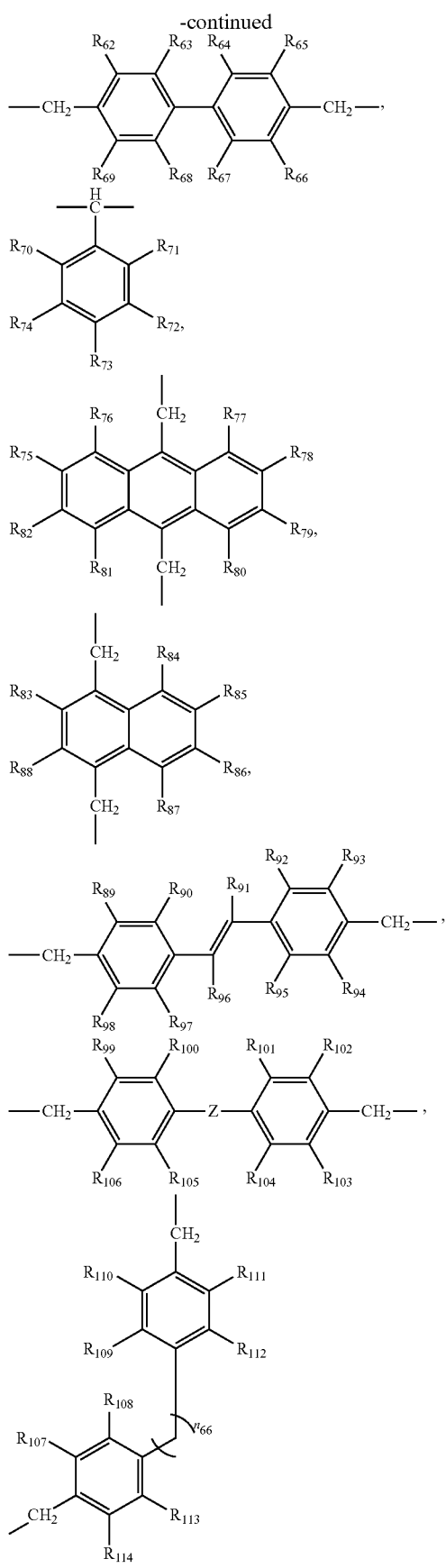

wherein, in Group 2, $R_{58}$ to $R_{114}$ are independently hydrogen, a hydroxy group, a halogen, a substituted or unsubstituted C1 to C30 alkyl group, a substituted or unsubstituted C3 to C30 cycloalkyl group, a substituted or unsubstituted C6 to C30 aryl group, a substituted or unsubstituted C3 to C30 cycloalkenyl group, a substituted or unsubstituted C7 to C20 arylalkyl group, a substituted or unsubstituted C1 to C20 heteroalkyl group, a substituted or unsubstituted C20 to C30 heterocycloalkyl group, a substituted or unsubstituted C2 to C30 heteroaryl group, a substituted or unsubstituted C2 to C30 alkenyl group, a substituted or unsubstituted C2 to C30 alkynyl group, or a combination thereof, $n_{66}$ is an integer of 0 to 30, and Z is C=O, oxygen (O), sulfur (S), $CR^bR^c$, $NR^d$, or a combination thereof, wherein $R^b$ to $R^d$ are independently hydrogen, a substituted or unsubstituted C1 to C10 alkyl group, a halogen atom, or a combination thereof.

4. The organic layer composition as claimed in claim 1, wherein the first compound is a polymer having a weight average molecular weight of about 1,000 to about 30,000.

5. The organic layer composition as claimed in claim 1, wherein in Chemical Formula 4, B is a cyclic group selected from Group 3, or a substituted cyclic group that is the cyclic group selected from Group 3 substituted with another substituent, and B' is a pyrene group, a perylene group, a benzoperylene group, a coronene group, or a combination thereof:

[Group 3]

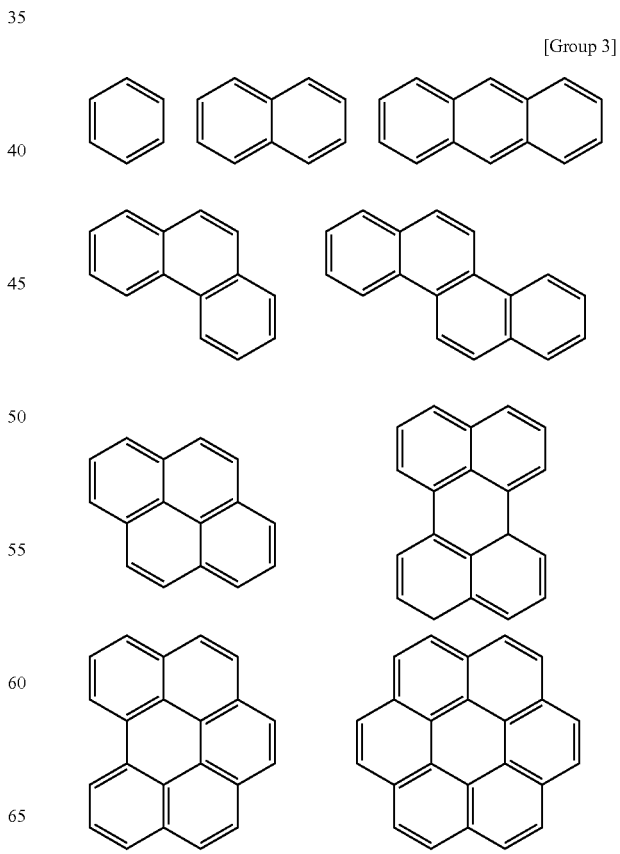

-continued

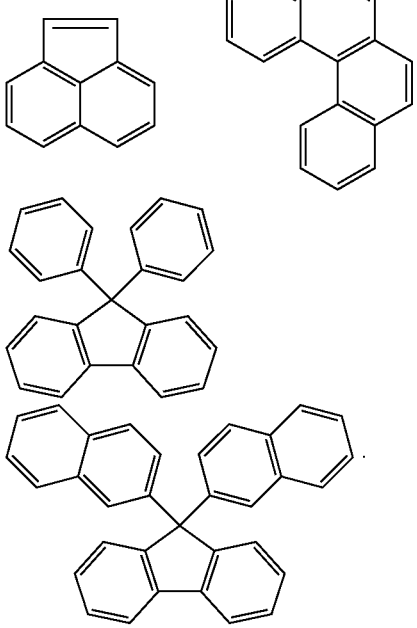

6. The organic layer composition as claimed in claim 1, wherein the first compound and the second compound are included in an amount of about 0.1 wt % to about 50 wt % based on the total amount of the organic layer composition.

7. A method of forming a pattern, the method comprising providing a material layer on a substrate,
applying the organic layer composition as claimed in claim 1 on the material layer,
heat-treating the organic layer composition to provide a hardmask layer,
providing a silicon-containing thin layer on the hardmask layer,
providing a photoresist layer on the silicon-containing thin layer,
exposing and developing the photoresist layer to form a photoresist pattern,
selectively removing the silicon-containing thin layer and the hardmask layer using the photoresist pattern to expose a part of the material layer, and
etching an exposed part of the material layer.

8. The method as claimed in claim 7, wherein the organic layer composition is applied using a spin-on coating method.

9. The method as claimed in claim 7, wherein the heat-treating is performed at about 100° C. to about 500° C.

10. The method as claimed in claim 7, which further comprises providing a bottom antireflective coating (BARC) before providing the photoresist layer.

11. The organic layer composition as claimed in claim 1, wherein second compound is a monomer having a molecular weight of about 500 to about 4,000.

* * * * *